United States Patent [19]

Koshino et al.

[11] 4,404,736
[45] Sep. 20, 1983

[54] METHOD FOR MANUFACTURING A SEMICONDUCTOR DEVICE OF MESA TYPE

[75] Inventors: Yutaka Koshino, Yokosuka; Takashi Ajima, Tokyo; Jiro Ohshima; Masahiro Abe, both of Yokohama, all of Japan

[73] Assignee: Tokyo Shibaura Denki Kabushiki Kaisha, Kawasaki, Japan

[21] Appl. No.: 319,411

[22] Filed: Nov. 9, 1981

[30] Foreign Application Priority Data

Nov. 13, 1980 [JP] Japan ............................. 55/159931

[51] Int. Cl.³ .......................................... H01L 21/316
[52] U.S. Cl. .................................. 29/576 W; 29/580
[58] Field of Search .................. 29/576 W, 580, 583; 357/50, 49

[56] References Cited

U.S. PATENT DOCUMENTS

4,335,501  6/1982  Wickenden et al. ......... 29/576 W X

FOREIGN PATENT DOCUMENTS

55-117242  9/1980  Japan ........................... 29/576 W

OTHER PUBLICATIONS

Bean, K. E. et al., "Some Properties of Vapor Deposited SiC", in *J. Electrochem. Soc.: Solid State Science*, 114(11), 11/67, pp. 1158-1161.

Aboaf, J. A., "Some Properties of Vapor Deposited Silicon Nitride Films . . . ", in *J. Electrochem. Soc.: Solid State Science*, 116(12), 12/69, pp. 1736-1740.

Blachman, A. G., "Use of Bias-Sputtered Film to Stress Bulk Material or Another Film", in *IBM-TDB*, 15(9), 2/73, pp. 2701-2702.

*Primary Examiner*—L. Dewayne Rutledge
*Assistant Examiner*—Alan E. Schiavelli
*Attorney, Agent, or Firm*—Finnegan, Henderson, Farabow, Garrett & Dunner

[57] ABSTRACT

A method for manufacturing a semiconductor device of mesa type comprises forming mesa recesses of predetermined depth around an element in the surface of a semiconductor body, forming on the back of semiconductor body a film for lessening the concentration of stress, filling glass powder into mesa recesses, and sintering glass powder to form glass insulators. According to the method of the present invention, cracks can be prevented from being caused in the semiconductor body and glass insulators formed in mesa recesses.

9 Claims, 11 Drawing Figures

METHOD FOR MANUFACTURING A SEMICONDUCTOR DEVICE OF MESA TYPE

BACKGROUND OF THE INVENTION

The present invention relates to a method for manufacturing a semiconductor device of mesa type.

According to the conventional method for manufacturing a semiconductor device of mesa type, a P-type semiconductor layer 3 is formed on an N+-type semiconductor layer 1 with an N-type semiconductor layer 2 interposed therebetween. After an N+-type impurity region 4 is formed at a predetermined region in the P-type semiconductor layer 3, an insulating layer 5 is formed on the surface of P-type semiconductor layer 3 to form a predetermined element. Mesa recesses 6 are then formed by chemical etching or blade dicing at predetermined regions of this element, each of mesa recesses 6 having a depth passing through the insulating layer 5, P-type semiconductor layer 3 and N-type semiconductor layer 2 into the N+-type semiconductor layer 1 and reaching a predetermined depth in the N+-type semiconductor layer 1 (see FIG. 1A).

Fine glass powder 7 mixed with organic solvent is filled in mesa recesses 6 by electrophoresis or the like (see FIG. 1B).

Glass powder 7 filled in the mesa recesses 6 is heated and sintered to form glass insulators 8, thus enabling a semiconductor device 9 of so-called mesa type to be obtained (see FIG. 1C).

However, in the case of this semiconductor device 9 thus manufactured, stress was concentrated in the semiconductor substrate provided with the element or in the glass insulators 8 causing cracks to form. As the result, the property of the element was so degraded as to make the element non-usable.

This concentration of stress is caused by the reason that the volume of glass powder 7 is reduced when it is sintered to form the glass insulators 8 as shown in FIG. 1C. Therefore, taking into account the volume reduction of glass powder 7, an excess volume of glass powder 7 is filled in the mesa recess 6 as shown in FIG. 1B. However, it was extremely difficult to accurately fill glass powder 7 into mesa recesses 6 taking into account the volume reduction of glass powder 7. In addition, the form of glass powder 7 filled was made irregular, thus making it impossible to completely prevent the concentration of stress.

SUMMARY OF THE INVENTION

The object of the present invention is to provide a method for manufacturing a semiconductor device of mesa type capable of preventing cracks from being caused in the semiconductor substrate and glass insulators formed in mesa recesses and enabling a semiconductor device to be manufactured to have excellent element property.

According to the present invention a method is provided for manufacturing a semiconductor device of mesa type comprising a step of forming mesa recesses of predetermined depth around an element in the surface of a semiconductor body, a step of forming on the back of the semiconductor body a film for lessening the concentration of stress, a step of filling glass powder into the mesa recesses, and a step of sintering the glass powder to form glass insulators.

DETAILED DESCRIPTION OF THE PREFERRED EMBODIMENT

Figure 1A:
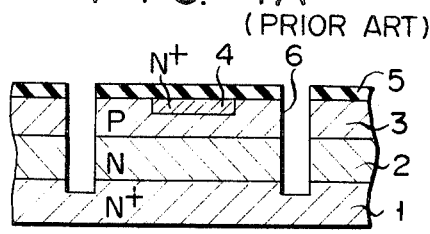
FIGS. 1A through 1C are explanatory views showing the conventional method for manufacturing a semiconductor device of mesa type.
Figure 1B:
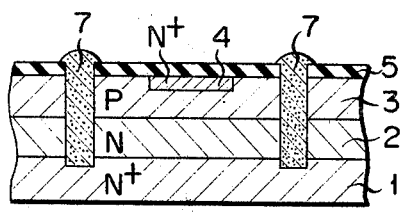
Figure 1C:
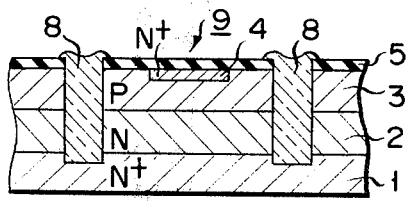

An embodiment of the present invention will be now described referring to the drawings.

Figure 2A:
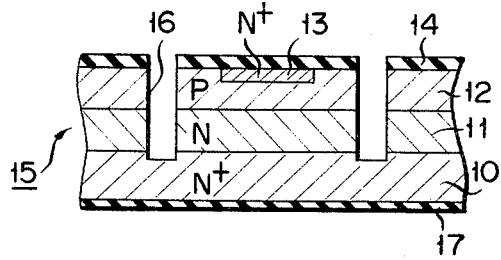
FIGS. 2A through 2C are explanatory views showing a method for manufacturing a semiconductor device of mesa type according to the present invention.

As shown in FIG. 2A, a semiconductor substrate 15 is provided in such a way that a P-type semiconductor layer 12 is formed on an N+-type semiconductor layer 10, for example, with an N-type semiconductor layer 11 interposed therebetween, that an N+-type impurity region 13 is formed at a predetermined region in the P-type semiconductor layer 12, and that an insulating layer 14 is formed on surface of impurity region 13 and P-type semiconductor layer 12. Mesa recesses 16 are formed by chemical etching or blade dicing at predetermined regions of this semiconductor substrate 15, each of mesa recesses 16 having a depth passing through the insulating layer 14, P-type semiconductor layer 12 and N-type semiconductor layer 11 into the N+-type semiconductor layer 11 and reaching a predetermined depth in the N+-type semiconductor layer 11. A film 17 for lessening the concentration of stress is then formed on the back of N+-type semiconductor layer 10.

Figure 3:
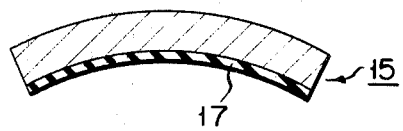
FIG. 3 shows the condition under which a film for lessening the concentration of stress is formed on the back of a semiconductor substrate.

The film 17 functions to bend the main surface of the semiconductor substrate 15 in a convex way as shown in FIG. 3 and, at a subsequent step, functions to relax the stress concentration resulting from the formation of a glass insulator 19 in the mesa recess 16. The film 17 is made of silicon nitride or silicon carbide, for example. The thickness of film 17 is determined depending upon the size of mesa recess 16 and particularly in such a way that the volume of mesa recess 16 after the removal of film 17 becomes equal to the volume of glass powder 18 reduced at the time when it is filled in the mesa recess 16 and sintered to form the glass insulator 19 by subsequent steps. The formation of film 17 may be achieved before mesa recesses 16 are formed.

Figure 2B:
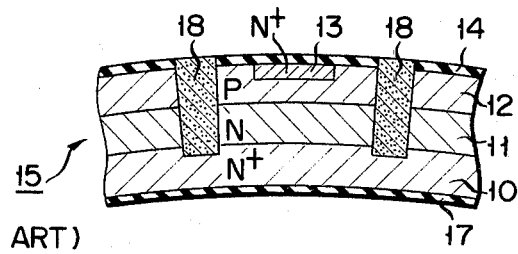
Figure 4:
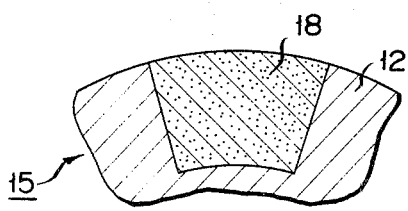
FIG. 4 shows the condition under which glass powder is filled in a mesa recess.

Fine glass powder 18 mixed with organic solvent is filled in mesa recesses 16 by electrophoresis or the like, as shown in FIG. 2B. The amount of glass powder 18 filled in the mesa recess 16 is so much as to form a surface contiguous to the main surface of semiconductor substrate 15, as shown in FIG. 4.

Figure 2C:
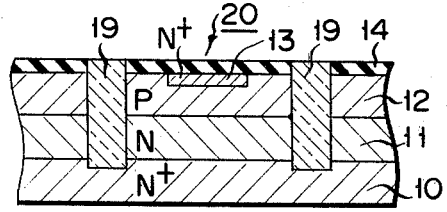

Glass powder 18 filled in mesa recesses 16 is heated and sintered to form glass insulators 19 and the film 17 is removed by chemical etching or mechanical polishing, thus enabling a semiconductor device of mesa type 20 to be obtained, as shown in FIG. 2C. The removal of film 17 may be carried out before the formation of glass insulators 19.

In the semiconductor device 20 thus manufactured the surfaces of glass insulators 19 and insulating film 14 were found to form a plane. It was also found that the shape of the mesa recess 16 after the glass insulator 19 is formed corresponded to the design value of mesa recess 16 before glass powder 18 was filled therein. In short, it was recognized in this semiconductor device 20 of mesa type that no concave deformation was caused on the main surface of semiconductor device 20 of mesa type even if glass powder 18 contracted at the time of forming glass insulators 19 and that no concentration of tensile stress which causes the main surface thereof to be deformed in concave was caused in the glass insulator 19 in the mesa recess 16. It was also recognized that this stabilized condition without concentration of stress was kept even after the semiconductor device 20 of mesa type was divided into pellets of predetermined shape to be mounted on a package or the like.

Figure 5:
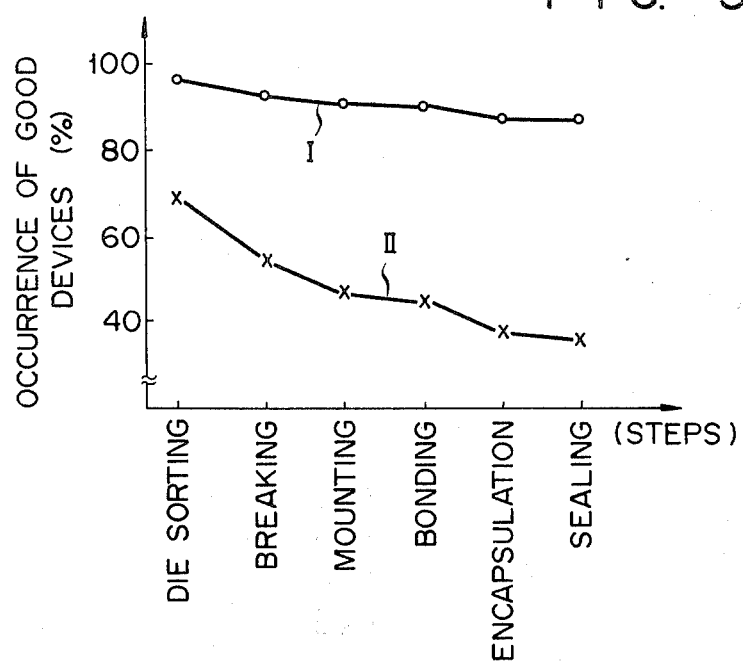
FIG. 5 is a graph showing how the ratio of good devices present changes with every manufacturing step.

The semiconductor device 20 of mesa type which was manufactured under the condition that glass insulators 19 had been formed under the process of the invention was subjected to die sorting, breaking, mounting, bonding, encapsulation and sealing steps to produce a desired product. A curve I in FIG. 5 represents the result obtained when check is made as to how the rate of good products present changed in each of the steps. A curve II in FIG. 5 represents the result obtained when it was checked how the rate of good products present changed in each of steps in the case of semiconductor devices of mesa type manufactured according to the conventional method.

Normal element operation was carried out at the atmosphere of 85° C. for 1,000 hours relating to semiconductor devices finished as products and it was checked how many products were regarded as inferior as the result of thermal strain and conductivity tests which were carried out during the time period. A curve I' in FIG. 6 denotes the result thus obtained. Another curve II' in FIG. 6 represents the result thus obtained relating to semiconductor devices of mesa type manufactured as products according to the conventional method.

Leak current at the P-N junction insulated by glass insulators 19 was further checked relating to semiconductor devices of mesa type manufactured and finished as products according to the present invention. A curve I'' in FIG. 7 represents the result thus obtained while another curve II'' in FIG. 7 the result thus obtained relating to products manufactured according to the conventional method.

Figure 6:
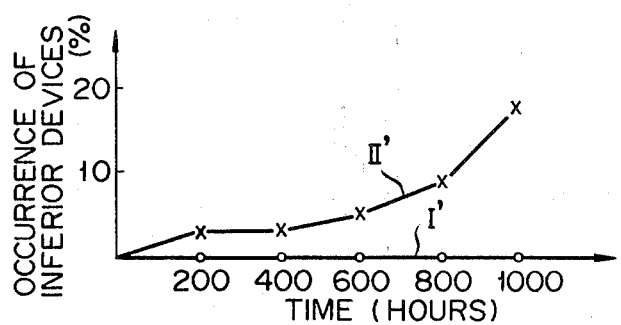
FIG. 6 is a graph showing how the ratio of inferior devices generated changes as time passes.
Figure 7:
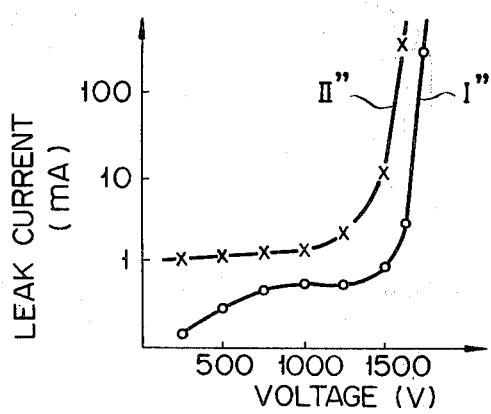
FIG. 7 is a graph showing leak current at the P-N junction.

As apparent from these test results shown in FIGS. 5 through 7, the semiconductor device of mesa type manufactured according to the present invention can prevents cracks from being caused in the semiconductor substrate 15 and glass insulators 19 and has extremely excellent element property. As apparent particularly from the result shown in FIG. 7, crystal condition is excellent at the semiconductor substrate 15, glass insulators 19 and P-N junction because no stress is added to the semiconductor substrate 15, so that leak current is improved to have a value better by one order as compared to that of semiconductor device manufactured according to the conventional method.

As described above, the method of manufacturing a semiconductor device of mesa type according to the present invention enables no crack to be caused in glass insulators formed in mesa recesses and the semiconductor substrate and a semiconductor device of mesa type to be easily manufactured having excellent element property.

What we claim is:

1. A method for manufacturing a semiconductor device of mesa type comprising:
    forming mesa recesses of predetermined depth around a semiconductor element in one surface of a semiconductor body;
    forming only on the entire opposite surface of said semiconductor body a film for lessening the concentration of stress;
    filling glass powder into said mesa recesses; and
    sintering glass powder to form glass insulators.

2. A method for manufacturing a semiconductor device of mesa type according to claim 1 wherein said film for lessening the concentration of stress is made of silicon nitride.

3. A method for manufacturing a semiconductor device of mesa type according to claim 1 wherein said film for lessening the concentration of stress is made of silicon carbide.

4. A method for forming glass insulators in a semiconductor device of the mesa type during the manufacture of the device comprising the steps of:
    (1) coating on one surface of a semiconductor body a film of a material tending to contract in film form;
    (2) bending said semiconductor body into a concave arc under the contraction of said film;
    (3) forming mesa recesses in the opposite surface of said semiconductor body, the lateral surfaces of said recesses diverging outwardly from the bottom of said recesses to the surface of said semiconductor body opposite said film;
    (4) filling said mesa recesses with glass powder;
    (5) sintering said glass powder to form glass insulators; and
    (6) removing said film to allow the semiconductor body to return to its planar state.

5. The method of claim 4 wherein said film is made of silicon nitride.

6. The method of claim 4 wherein said film is made of silicon carbide.

7. A method for forming glass insulators in a semiconductor device of the mesa type during the manufacture of the device comprising the steps of:
    (1) forming mesa recesses in a semiconductor body;
    (2) coating on one surface of a semiconductor body a film of a material tending to contract in film form;
    (3) bending said semiconductor body into a concave arc under the contraction of said film;
    (4) filling said mesa recesses with glass powder;
    (5) sintering said glass powder to form glass insulators; and
    (6) removing said film to allow the semiconductor body to return to its planar state not earlier than said step of filling.

8. The method of claim 7 wherein said film is made of silicon nitride.

9. The method of claim 7 wherein said film is made of silicon carbide.

* * * * *